United States Patent
Kim et al.

(10) Patent No.: US 12,351,898 B2
(45) Date of Patent: Jul. 8, 2025

(54) DEPOSITION MASK AND METHOD OF MANUFACTURING THE DEPOSITION MASK

(71) Applicant: Samsung Display Co., Ltd., Yongin-si (KR)

(72) Inventors: Hwi Kim, Suwon-si (KR); In Bae Kim, Daejeon (KR); Sung Soon Im, Suwon-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 568 days.

(21) Appl. No.: 17/742,355

(22) Filed: May 11, 2022

(65) Prior Publication Data

US 2022/0267888 A1 Aug. 25, 2022

Related U.S. Application Data

(63) Continuation of application No. 16/674,997, filed on Nov. 5, 2019, now Pat. No. 11,345,988.

(30) Foreign Application Priority Data

Dec. 27, 2018 (KR) .................. 10-2018-0170875

(51) Int. Cl.
  *C23C 14/04* (2006.01)
  *C23C 16/04* (2006.01)
  (Continued)

(52) U.S. Cl.
  CPC .......... *C23C 14/042* (2013.01); *C23C 16/042* (2013.01); *H10K 50/00* (2023.02); *H10K 71/00* (2023.02); *H10K 71/166* (2023.02)

(58) Field of Classification Search
  CPC .. C23C 14/042; C23C 16/042; H10K 71/166; H10K 71/00; H10K 50/00
  (Continued)

(56) References Cited

U.S. PATENT DOCUMENTS 10,018,920 B2 * 7/2018 Chang .................... G03F 7/201
2014/0290574 A1 * 10/2014 Kim ........................ H10K 59/00
                                                                118/504
(Continued)

FOREIGN PATENT DOCUMENTS

| CN | 107574408 A | 1/2018 |
| CN | 108611593 A | 10/2018 |

(Continued)

OTHER PUBLICATIONS

Benavides et al., (Effects of Plasma Formation on Reflection of Laser Light in Ablation of Metals in Air, PIERS Proceedings, Stockholm, Sweeden, Aug. 12-15, 2013) (Year 2013).

(Continued)

*Primary Examiner* — Jami Valentine Miller
(74) *Attorney, Agent, or Firm* — CANTOR COLBURN LLP

(57) ABSTRACT

A method of manufacturing a deposition mask includes preparing a mask-target substrate which has one surface on which a sacrificed layer pattern is formed and comprises a cover area covered by the sacrificed layer pattern and a plurality of exposed areas exposed by the sacrificed layer pattern; forming holes in the exposed areas of the mask-target substrate by emitting laser toward the mask-target substrate; and removing the sacrificed layer pattern, wherein the sacrificed layer pattern has a higher reflectance with respect to the laser than a reflectance of the mask-target substrate.

5 Claims, 22 Drawing Sheets

(51) Int. Cl.
*H10K 50/00* (2023.01)
*H10K 71/00* (2023.01)
*H10K 71/16* (2023.01)

(58) Field of Classification Search
USPC .......................................................... 257/40
See application file for complete search history.

(56) References Cited

U.S. PATENT DOCUMENTS

| | | |
|---|---|---|
| 2019/0055640 A1 | 2/2019 | Sakio et al. |
| 2019/0106781 A1 | 4/2019 | Saiko et al. |
| 2019/0221741 A1 | 7/2019 | Tang |
| 2020/0208249 A1* | 7/2020 | Kim ..................... C23C 16/042 |
| 2020/0303179 A1 | 9/2020 | Saiko |
| 2021/0249588 A1* | 8/2021 | Gottwald ............... H10N 50/10 |
| 2021/0391215 A1* | 12/2021 | Feng ................. H01L 21/76897 |

FOREIGN PATENT DOCUMENTS

| | | |
|---|---|---|
| CN | 108699670 A | 10/2018 |
| JP | 2008177553 | 7/2008 |
| JP | 2013004926 A | 1/2013 |
| JP | 2017145402 | 8/2017 |
| JP | 6345901 | 6/2018 |
| KR | 1020180049463 | 5/2018 |
| KR | 1020180104782 | 9/2018 |
| KR | 1020180128115 | 12/2018 |
| WO | 2017168773 A1 | 10/2017 |
| WO | 2017168774 | 10/2017 |
| WO | 2019033481 | 2/2019 |

OTHER PUBLICATIONS

Jingxing Feng (Characterization of native oxide and passive film on iron and iron-chromium alloy, as a Master of Science thesis from the University of Cincenaty. Jul. 2014) found in web-page: [https://etd.ohiolink.edu/apexprod/rws_etd/send_file/send?accession=ucin1406811146&disposition=inline] (Year:2014).

Volkov et al., (Thermal Oxidative Degradation of Molybdenum Films under Laser Ablation) Technical Physics, 2015, vol. 60, No. 2, pp. 265-269, (Year: 2015).

Korean Office Action—Korean Application No. 10-2018-0170875 dated Aug. 28, 2023, citing references listed within.

\* cited by examiner

DEPOSITION MASK AND METHOD OF MANUFACTURING THE DEPOSITION MASK

This application is a continuation of U.S. patent application Ser. No. 16/674,997, filed on Nov. 5, 2019, which claims priority to Korean Patent Application No. 10-2018-0170875, filed on Dec. 27, 2018, and all the benefits accruing therefrom under 35 U.S.C. § 119, the content of which in its entirety is herein incorporated by reference.

BACKGROUND

1. Field

The disclosure relates to a deposition mask and a method of manufacturing the same.

2. Description of the Related Art

An organic light emitting display ("OLED") device receives attention as a next-generation display device as a self-luminous display device that has desired characteristics such as a wide viewing angle, high contrast, and a quick response speed.

Such an OLED device typically includes an intermediate layer including at least a light emitting layer between opposite electrodes. The electrodes and the intermediate layer may be formed using a variety of methods, e.g., a deposition method.

SUMMARY

Embodiments of the disclosure provide a method of manufacturing a deposition mask with improved manufacturing process efficiency.

Embodiments of the disclosure also provide a deposition mask manufactured using the method of manufacturing the deposition mask with improved manufacturing process efficiency.

According to an embodiment of the disclosure, a method of manufacturing a deposition mask includes preparing a mask-target substrate which has a surface on which a sacrificed layer pattern is provided and comprises a cover area covered by the sacrificed layer pattern and a plurality of exposed areas exposed by the sacrificed layer pattern; forming holes in the exposed areas of the mask-target substrate by emitting laser toward the mask-target substrate; and removing the sacrificed layer pattern, where a reflectance of the sacrificed layer pattern with respect to the laser is higher than a reflectance of the mask-target substrate with respect to the laser.

In an embodiment, the preparing the mask-target substrate may include providing the sacrificed layer pattern in a way such that the cover area of the mask-target substrate completely surrounds each of the exposed areas of the target substrate.

In an embodiment, the forming the holes in the exposed areas of the mask-target substrate by emitting the laser toward the mask-target substrate may include emitting the laser partially toward the cover area of the mask-target substrate.

In an embodiment, the reflectance of the sacrificed layer pattern with respect to the laser may be about 70% or greater.

In an embodiment, the laser may have a single-wavelength in a wavelength range from about 400 nanometers (nm) to about 600 nm.

In an embodiment, the mask-target substrate may include an Invar alloy which includes nickel and iron.

In an embodiment, the sacrificed layer pattern may include at least one of aluminum, silver, and magnesium.

In an embodiment, the removing the sacrificed layer pattern may be performed using a first etchant.

In an embodiment, an etching rate of the first etchant with respect to the sacrificed layer pattern may be higher than an etching rate thereof with respect to the mask-target substrate.

In an embodiment, after the laser is emitted toward the mask-target substrate, dust oxide films may be formed on an inner surface of the cover area which faces the exposed area and side surfaces and an upper surface of the sacrificed layer pattern.

In an embodiment, the removing the sacrificed layer pattern may include removing the dust oxide films formed on the side surfaces and the upper surface of the sacrificed layer pattern.

In an embodiment, the removing the sacrificed layer pattern including the removing the dust oxide films formed on the side surfaces and the upper surface of the sacrificed layer pattern may be performed within 30 minutes.

In an embodiment, the method may further include removing, after the sacrificed layer pattern is removed, the dust oxide film formed on the inner surface of the cover area which faces the exposed area.

In an embodiment, the removing of the dust oxide film which is formed on the inner surface of the cover area which faces the exposed area is performed using a second etchant which is different from a first etchant, which is used for the removing the sacrificed layer pattern.

In an embodiment, the providing the sacrificed layer pattern on the surface of the mask-target substrate may be performed using at least one of a photolithography process, an electroplating process, and a sputtering process.

According to another embodiment of the disclosure, a deposition mask includes a mask body which includes a plurality of hole areas disposed while being spaced apart from each other and a lip region which surrounds each of the hole areas; and a dust oxide film disposed on an inner surface of the lip region which faces the hole area of the mask body.

In an embodiment, the dust oxide film may not be disposed on an upper surface of the lip region of the mask body.

In an embodiment, the mask body may include an Invar alloy which include nickel and iron, and the dust oxide film may include a nickel oxide and an iron oxide.

In an embodiment, the deposition mask may further include a residual film which is disposed on an upper surface of the lip region of the mask body and includes a material different from that of the dust oxide film.

In an embodiment, the residual film may include at least one of aluminum, silver, and magnesium.

BRIEF DESCRIPTION OF THE DRAWINGS

The above and other features of the invention will become more apparent by describing in detail exemplary embodiments thereof with reference to the attached drawings, in which.

DETAILED DESCRIPTION

Figure 1:
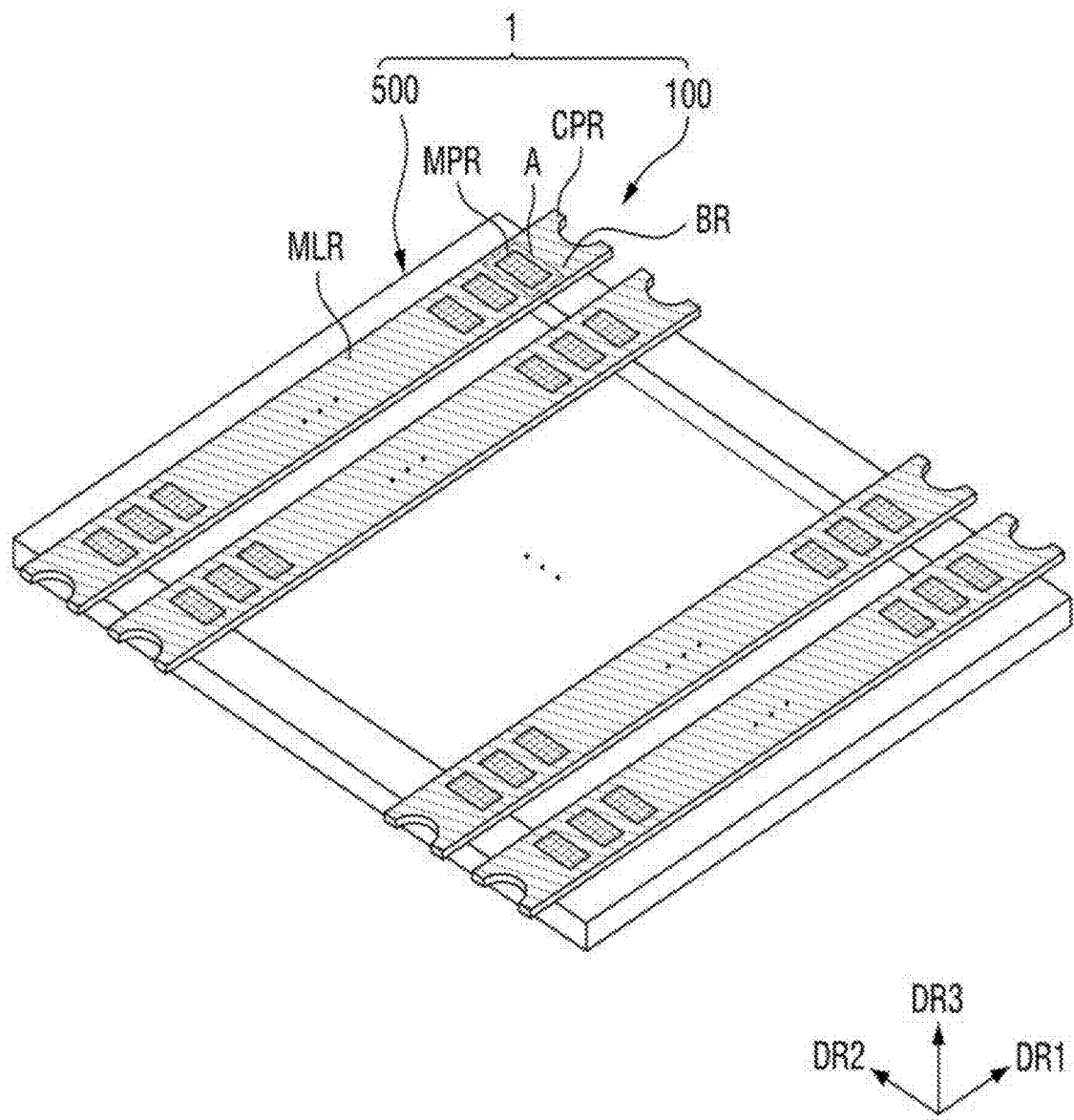
FIG. 1 is a perspective view of a deposition mask assembly according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments of the invention will be described in detail with reference to the accompanying drawings.

Figure 2:
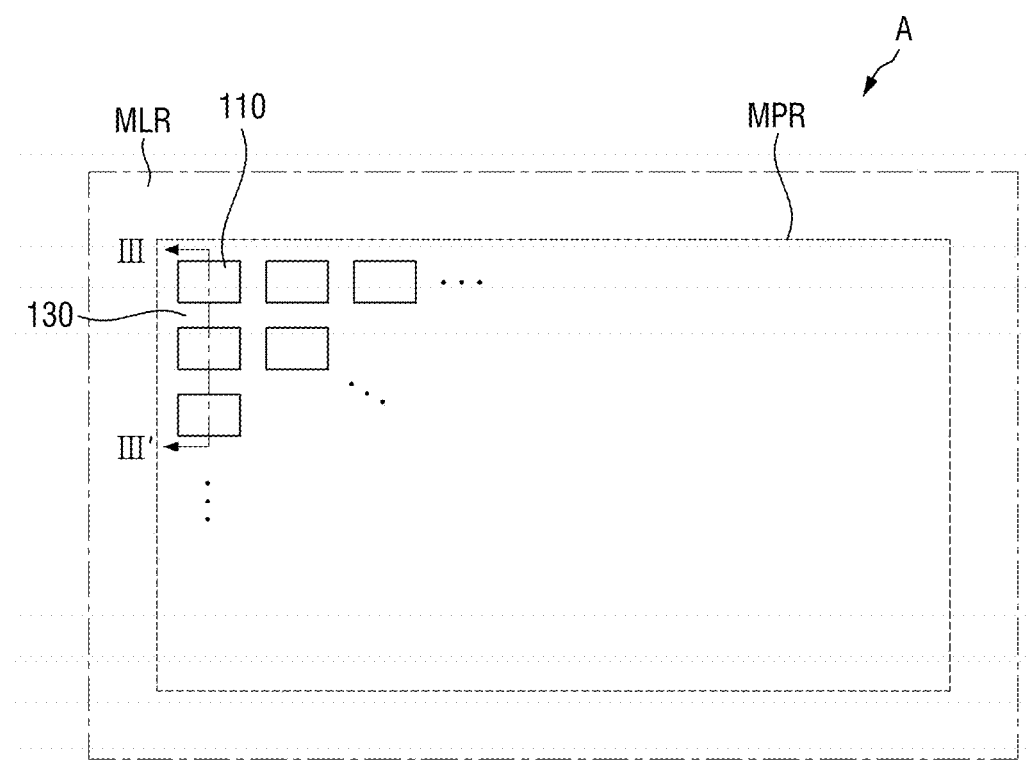
FIG. 2 is an enlarged plan view illustrating an area A in FIG. 1.

FIG. 1 is a perspective view of a deposition mask assembly according to an exemplary embodiment of the disclosure, and FIG. 2 is an enlarged plan view of an area A in FIG. 1.

An exemplary embodiment of a deposition mask assembly may be used in a deposition process of depositing an organic material layer or an inorganic material layer, which is included in not only portable electronic devices such as a mobile phone, a smart phone, a tablet personal computer ("PC"), a smart watch, a watch phone, a mobile communication terminal, an electronic notebook, an electronic book, a portable multimedia player ("PMP"), a navigation system, an ultra-mobile PC, and the like but also display devices such as a television, a laptop PC, a monitor, an advertising panel, an Internet of things ("IoT") or the like. In one exemplary embodiment, for example, the deposition mask assembly may be used for depositing an organic emitting layer or an organic thin film such as a hole injection/transporting layer, an electron injection/transporting layer, and the like in an organic emitting display device and may be used for deposition of other organic films, inorganic films, metallic patterns and the like. A deposition mask may be a fine metal mask ("FMM") which has an opening portion having a same pattern as a pattern of a thin film to be formed on a target substrate.

Referring to FIGS. 1 and 2, an exemplary embodiment of a deposition mask assembly 1 includes a deposition mask 100 and a mask frame 500.

The mask frame 500 may fix or hold the deposition mask 100 and, for example, be coupled with the deposition mask 100 by welding. The mask frame 500 may have a quadrangular frame shape with an opening in a center as shown in FIG. 1. The mask frame 500 may include two short-side frames, which have a predetermined width and extend in a first direction DR1, and two long-side frames, which have a predetermined width and extend in a second direction DR2 intersecting with the first direction DR1, but is not limited thereto.

The mask frame 500 may include a material having high hardness, for example, a metal such as stainless steel and the like.

The deposition mask 100 may have a linear shape which extends in one direction. In one exemplary embodiment, for example, the deposition mask 100, as shown in FIG. 1, may extend in the first direction DR1 to cross the two long-side frames and the opening in the central part of the mask frames 500, and may be disposed on the two long-side frames and the opening in the central part of the mask frame 500. The deposition mask 100 may be fixed to the two long-side frames of the mask frame 500.

A plurality of deposition masks 100 may be provided or defined. Each of the deposition masks 100 may be disposed in one direction. In one exemplary embodiment, for example, the deposition masks 100 may be disposed in the second direction DR2 while being spaced apart as shown in FIG. 1 but are not limited thereto and may be disposed in the second direction DR2 while being substantially overlapped with each other.

In an alternative exemplary embodiment, where the two short-side frames and the two long-side frames of the mask frame 500 extend in opposite directions from the directions described above, an extension direction and an arrangement direction of each of the deposition masks 100 may differ from the above-described directions.

The deposition mask 100 may include a mask pattern region MPR (or a mask body region) and a main lip region MLR in a central part and may include a binding region BR and a clamping region CPR on both end portions in an extension direction thereof.

The clamping regions CPR may be disposed on the both ends (in the first direction DR1) of the deposition mask 100 and may have a concave shape (e.g., an inwardly curved) on the both ends of the deposition mask 100. The clamping regions CPR are parts to which clamps (not shown) elongating toward the both ends (in the first direction DR1) before the deposition mask 100 is coupled to the mask frame 500 by welding are coupled, and the clamping regions CPR may be removed or cut off after the welding process.

The binding regions BR may be disposed near the clamping regions CPR and may be disposed to overlap the mask frame 500 in a thickness direction or a third direction DR3. In an exemplary embodiment, as shown in FIG. 1, the binding regions BR may be located near the clamping regions CPR located on the both ends of the deposition mask 100. Each of the binding regions BR may be attached or coupled to the mask frame 500 by welding. In one exemplary embodiment, for example, the binding regions BR may be welded to the two long-side frames of the mask frame 500.

The main lip region MLR may be disposed in the central part of the deposition mask 100. The main lip region MLR may be disposed in the central opening which is exposed by the mask frame 500. The main lip region MLR may be physically connected to the binding regions BR and may surround the mask pattern region MPR. The main lip region MLR may be disposed between the adjacent mask pattern regions MPR and around the periphery of the mask pattern region MPR in the second direction DR2 to completely surround the mask pattern region MPR in a same plane. The main lip regions MLR may be integrally formed as a single unitary and indivisible unit with each other.

The main lip region MLR may divide the adjacent mask pattern regions MPR and may function as a mold of the deposition mask 100. In one exemplary embodiment, for example, when a deposition material is deposited on a deposition-target substrate, the main lip region MLR may be formed at a position corresponding to an area excluding a pattern of the material deposited on the deposition-target substrate.

The mask pattern regions MPR, like the main lip region MLR, may be disposed in the central part of the deposition mask 100 and may be disposed to overlap the central opening exposed by the mask frame 500. The mask pattern region MPR may be completely surrounded by the main lip region MLR in a same plane. In such an embodiment, the mask pattern region MPR may be completely surrounded by a structural material of the deposition mask 100 in the same plane.

A plurality of such mask pattern regions MPR may be defined or provided in a single deposition mask 100. The mask pattern regions MPR may be disposed along one direction (e.g., the first direction DR1) while being spaced apart from each other in the one direction, as shown in FIG. 1. In an exemplary embodiment, the mask pattern regions MPR are disposed in a single line as shown in FIG. 1, but are not limited thereto. Alternatively, the mask pattern regions MPR may be disposed or arranged in two or more lines.

In an exemplary embodiment, a plurality of mask holes 110 is defined in the mask pattern region MPR, and the mask pattern region MPR may include a plurality of sub lip regions 130 disposed near the plurality of mask holes 110. The sub lip regions 130 may be physically connected to the main lip region MLR. The sub lip regions 130 may include or be formed of a same material as the main lip region MLR.

In one exemplary embodiment, for example, when a deposition material is deposited on a deposition-target substrate, the sub lip region 130 may be disposed or formed at a position corresponding to an area excluding a pattern of the material deposited on the deposition-target substrate.

The sub lip region 130 may surround the mask hole 110 in a same plane, thereby defining the mask hole 110. The sub lip region 130 may be disposed between the adjacent mask holes 110 and near the mask hole 130 in the second direction DR2 to completely surround the mask hole 110 in the same plane. The sub lip region 130 may be integrally formed as a single unitary and indivisible unit with a corresponding mask pattern region MPR. The sub lip region 130 may define the adjacent mask holes 110.

The mask hole 110 may be completely surrounded by the sub lip region 130 in the same plane. In such an embodiment, the sub lip region 130 may be defined by a structure material of the deposition mask 100 that completely surrounds the mask hole 110 in the same plane.

The plurality of mask holes 110 may be provided. The mask holes 110 may be disposed along a row and column direction while being spaced apart as shown in FIG. 2.

In an exemplary embodiment, each of the mask holes 110 has a rectangular dot type plane shape as shown in FIG. 2 but are not limited thereto. Alternatively, the mask holes 110 may have a square, circular, or other polygonal dot shape or a slit shape which extends in one direction.

Here, unless defined otherwise, the terms "upper part," "top," and "upper surface" refer to a side or direction where the deposition mask 100 is viewed on the basis of the mask frame 500, and the terms "lower part," "bottom," and "lower surface" refer to a side or direction where the mask frame 500 is viewed on the basis of the deposition mask 100.

The plurality of mask holes 110 may cross an upper surface of the deposition mask 100 (an upper surface in a third direction DR3 in FIG. 1) and a lower surface of the deposition mask 100 (a lower surface in the third direction DR3 in FIG. 1). In one exemplary embodiment, for example, when a deposition material is deposited on a deposition-target substrate, the mask holes 110 may be disposed at a position corresponding to a pattern of the material to be deposited on the deposition-target substrate.

The deposition mask 100 may include a mask material. In one exemplary embodiment, for example, the applicable mask material may include at least one of chrome (Cr), molybdenum (Mo), titanium (Ti), tin (Sn), gold (Au), nickel (Ni), an nickel alloy, an nickel-cobalt alloy, and the like.

In an exemplary embodiment, the deposition mask 100 may include an Invar alloy. The Invar alloy may include a steel-nickel alloy. In one exemplary embodiment, for example, a nickel content of the Invar alloy may be about 36% and an iron content may be about 64%. However, the nickel and iron contents are not limited to the stated numerical values and a part may vary as desired. The Invar alloy may include some impurities such as carbon, sulfur, and the like in addition to nickel and iron.

The Invar alloy of the deposition mask 100 may be formed using a rolling method or an electroplating method.

In an exemplary embodiment, the deposition mask 100 may include a super Invar alloy which includes a nickel content of about 32%, an iron content of about 63%, and a cobalt content of about 5%.

Hereinafter, a cross-sectional shape of the deposition mask 100 will be described in detail with reference to FIG. 3.

Figure 3:
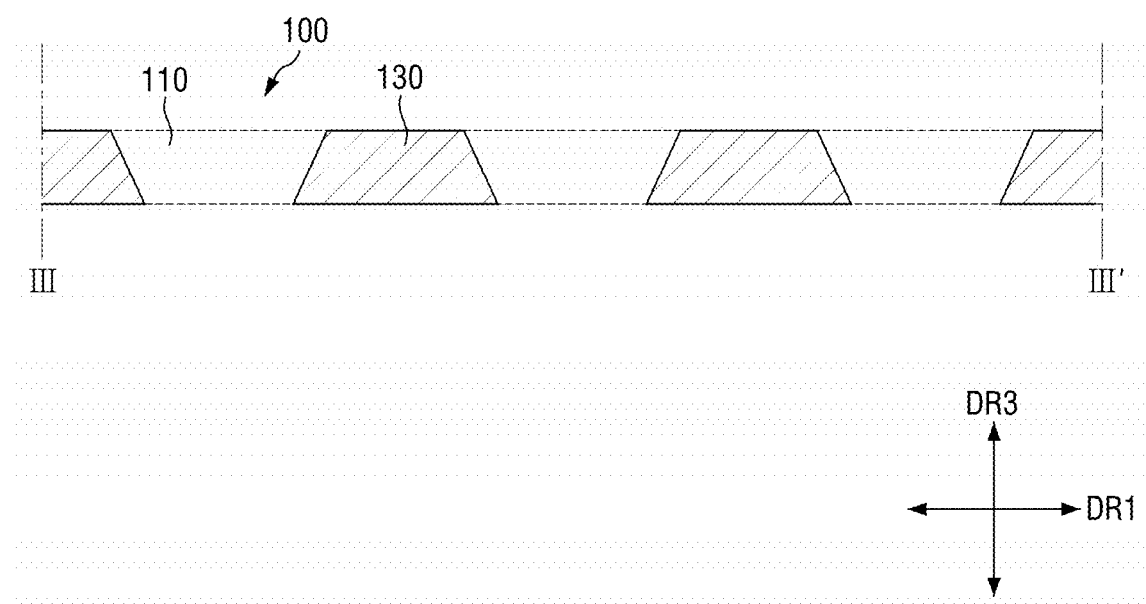
FIG. 3 is a cross-sectional view taken along line in FIG. 2.

FIG. 3 is a cross-sectional view taken along line in FIG. 2. Referring to FIG. 3, the sub lip regions 130 are disposed around the periphery of the adjacent mask hole 110. Parts of the sub lip region 130 are disposed while being spaced apart from each other with the mask hole 110 interposed therebetween in FIG. 3 but the sub lip regions 130 may be integrally formed as a single unitary and indivisible unit with each other as shown in FIG. 2. In FIG. 3, a dotted line, which connects the spaced parts of the sub lip region 130, is additionally shown.

A cross-sectional shape of the sub lip region 130 may correspond to a cross-sectional shape of the mask hole 110.

Referring to FIG. 3, in an exemplary embodiment, the cross-sectional shape of the sub lip region 130 may have a width which gradually decreases from a lower surface toward an upper surface. The cross-sectional shape of the mask hole 110 corresponding thereto may have a width which gradually increases from a lower surface toward an upper surface. In such an embodiment, the cross-sectional shape of the sub lip region 130 may be a tapered shape, and the cross-sectional shape of the mask hole 110 may be a reverse-tapered shape.

In an exemplary embodiment, where the mask hole 110 is formed using lasers, the sub lip region 130 and the mask hole 110 may have the cross-sectional shapes shown in FIG. 3.

The cross-sectional shape of the sub lip region 130 and/or the mask hole 110 may be variously modified according to a process of forming the mask hole 110.

In an alternative exemplary embodiment, the cross-sectional shape of each of the sub lip region 130 and the mask hole 110 may have a width which is substantially equal from a lower surface to an upper surface unlike the shown in FIG. 3. In another alternative exemplary embodiment, the cross-sectional shape of the sub lip region 130 may be a reverse tapered shape which has a width which gradually increases from a lower surface toward an upper surface, and the sub lip region 130 may be a tapered shape which has a width which gradually decreases from a lower surface toward an upper surface.

Figure 4:
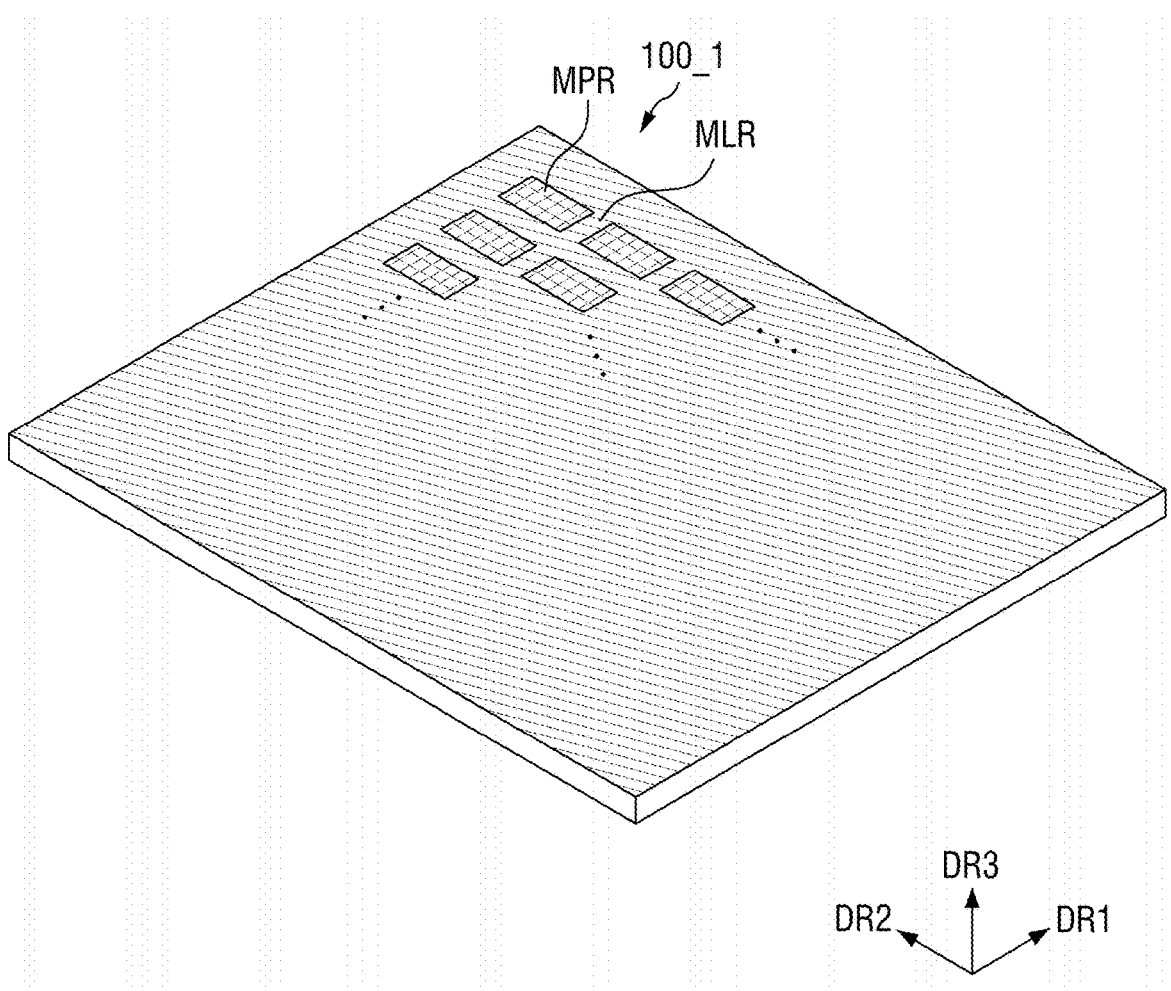
FIG. 4 is a perspective of a deposition mask according to an alternative exemplary embodiment.

In an exemplary embodiment, the deposition mask 100 includes a plurality of masks separated or spaced apart from each other as shown in FIG. 1, but not being limited thereto. Alternatively, the deposition mask 100 may include a single mask having a size substantially the same as that of combination of the plurality of separate masks shown in FIG. 1. FIG. 4 is a perspective view of a deposition mask according to an alternative exemplary embodiment.

Referring to FIG. 4, a deposition mask 100_1 may be a single mask which is integrally formed as a single unitary and indivisible unit. In such an embodiment, the deposition mask 100_1, like the deposition mask 100 of FIG. 1, may include a plurality of mask pattern regions MPR and a main lip region MLR which is integrally formed as a single unitary and indivisible unit to surround the plurality of mask pattern regions MPR in a same plane.

In such an embodiment, a plurality of holes is defined in each of the mask pattern regions MPR, and each of the mask pattern regions MPR includes a sub lip region which surrounds the plurality of holes in the same plane and is integrally formed as a single unitary and indivisible unit in each of the mask pattern regions MPR. For convenience of description, any repetitive detailed description of the same or like components described above with reference to FIGS. 1 and 2 will be omitted.

Figure 5:
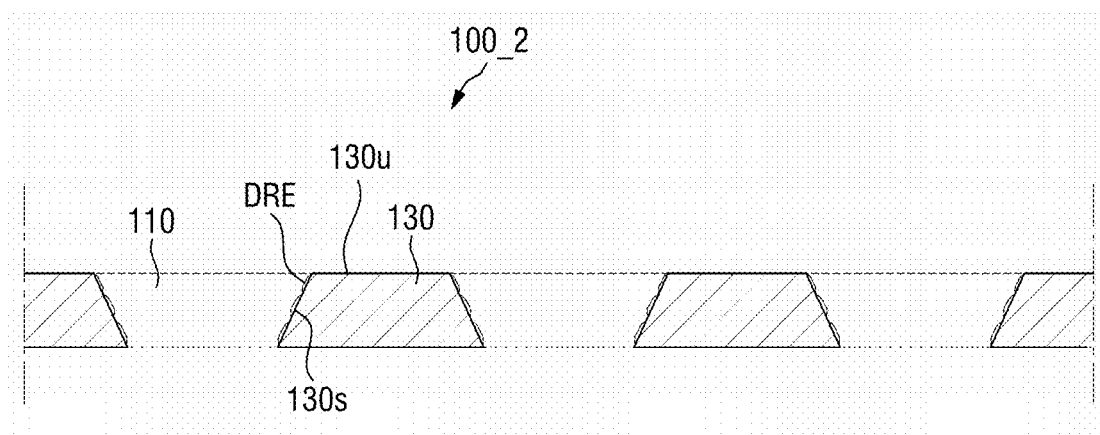
FIG. 5 is a cross-sectional view of a deposition mask according to another alternative exemplary embodiment.

FIG. 5 is a cross-sectional view of a deposition mask according to still another alternative exemplary embodiment.

Referring to FIG. 5, in an exemplary embodiment of a deposition mask 100_2, the sub lip region 130 includes an upper surface 130u and side surfaces 130s (or inner surfaces) that define the mask hole 110 and further includes a dust oxide film DRE disposed on the side surfaces 130s of the sub lip region 130. The side surfaces 130s of the sub lip region 130 may be inner surfaces which defines the adjacent mask hole 110.

In such an embodiment, the dust oxide film DRE is not disposed on the upper surface 130u of the sub lip region 130 and may be disposed on at least a part of the side surface 130s of the sub lip region 130. The dust oxide film DRE may be disposed on opposing side surfaces 130s of the sub lip region 130. The dust oxide film DRE may be directly disposed on and come into contact with the opposing side surfaces 130s of the sub lip region 130.

In an exemplary embodiment, the dust oxide film DRE may be partially disposed on the side surface 130s of the sub lip region 130 to expose a part thereof, as shown in FIG. 5, but is not limited thereto. Alternatively, the dust oxide film DRE may be disposed on the entire surface of the side surfaces 130s of the sub lip region 130 to cover the side surface 130s.

The dust oxide film DRE may include a structure material of the deposition mask 100_2 and oxygen. In an embodiment where the deposition mask 100_2 includes an Invar alloy including nickel and iron, the dust oxide film DRE may include nickel oxide and iron oxide.

In an exemplary embodiment, where the Invar alloy of the deposition mask 100_2 includes some impurities, for example, sulfur and/or carbon, the dust oxide film DRE may further include a compound of sulfur and oxygen and/or a compound of carbon and oxygen in addition to the nickel oxide and iron oxide.

Figure 6:
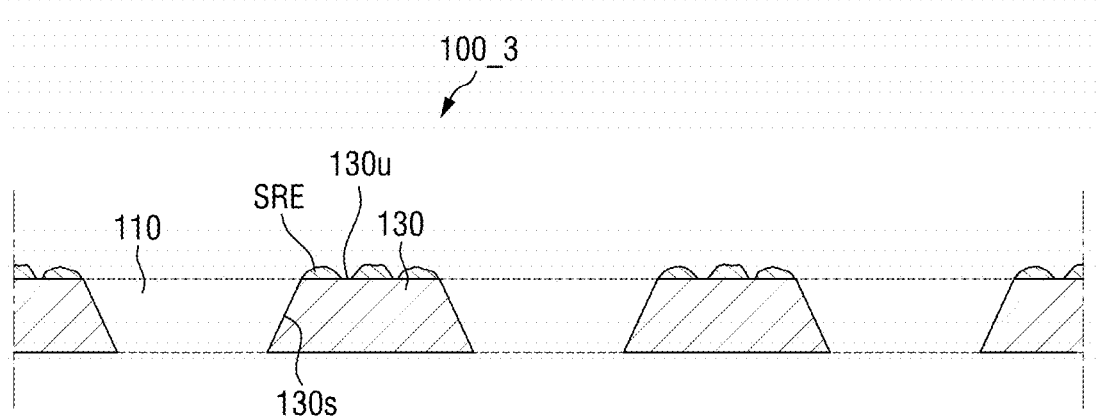
FIG. 6 is a cross-sectional view of a deposition mask according to still another alternative exemplary embodiment.

FIG. 6 is a cross-sectional view of a deposition mask according to still another alternative exemplary embodiment.

Referring to FIG. 6, an exemplary embodiment of the deposition mask 100_3 further includes a residual film SRE disposed on the upper surface 130u of the sub lip region 130.

In such an embodiment, the residual film SRE is disposed only on the upper surface 130u of the sub lip region 130 and is not disposed on the side surfaces 130s of the sub lip region 130. The residual film SRE may be directly disposed on and come into contact with the upper surface 130u of the sub lip region 130.

In an exemplary embodiment, the residual film SRE is partially disposed on the upper surface 130u of the sub lip region 130 to expose a part thereof as shown in FIG. 6, but is not limited thereto. Alternatively, the residual film SRE may be disposed on the entire surface of the upper surface 130u of the sub lip region 130 to cover the upper surface 130u.

The residual film SRE may be a sacrificed layer which partially remains after being used in a manufacturing process. The sacrificed layer and the residual film SRE may include or be formed of a material having high reflectance with respect to lasers and a detailed description thereof will be described later in greater detail.

Figure 7:
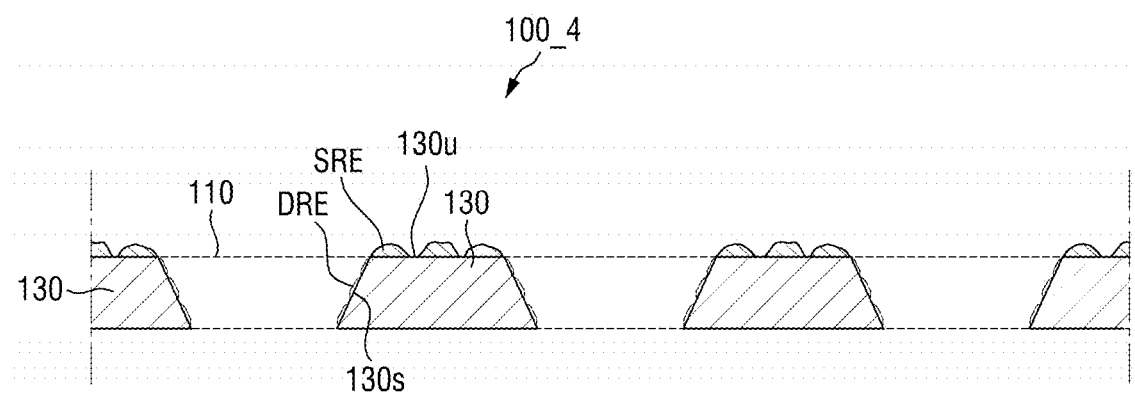
FIG. 7 is a cross-sectional view of a deposition mask according to yet another alternative exemplary embodiment.

FIG. 7 is a cross-sectional view of a deposition mask according to yet another alternative exemplary embodiment.

Referring to FIG. 7, an exemplary embodiment of a deposition mask 100_4 further includes dust oxide film DRE of FIG. 5 and a residual film SRE of FIG. 6.

In such an embodiment, a residual film SRE of the deposition mask 100_4 may be disposed on only the upper surface 130u of the sub lip region 130 and may not be disposed on the side surfaces 130s of the sub lip region 130, and a dust oxide film DRE of the deposition mask 100_3 may not be disposed on the upper surface 130u of the sub lip region 130 and may be disposed on at least a part of the side surfaces 130s of the sub lip region 130.

Hereinafter, a method of manufacturing the deposition mask 100 according to an exemplary embodiment will be described.

Figure 8:
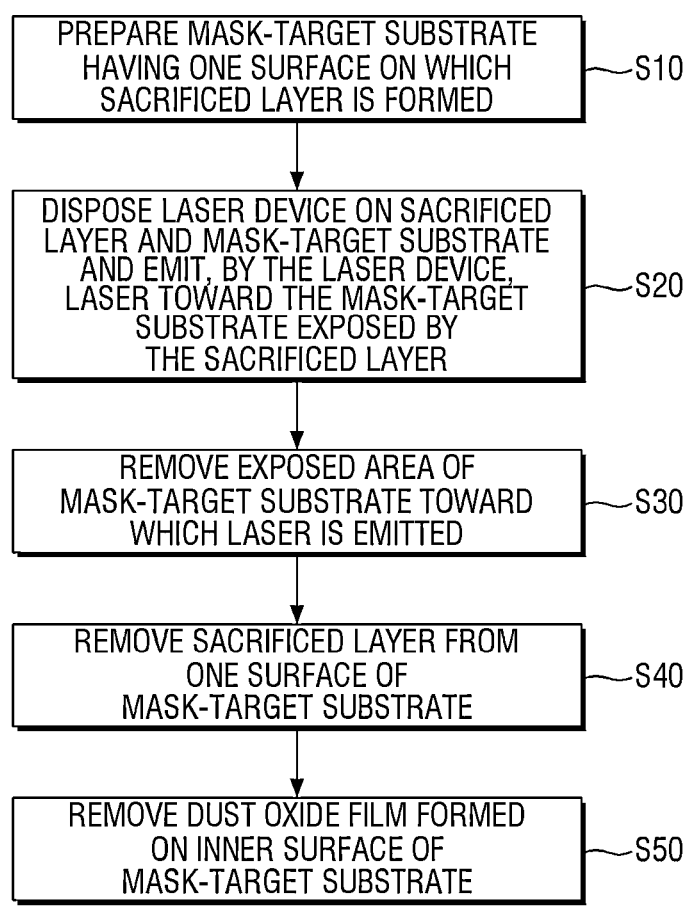
FIG. 8 is a flowchart illustrating a method of manufacturing a deposition mask according to an exemplary embodiment.
Figure 9:
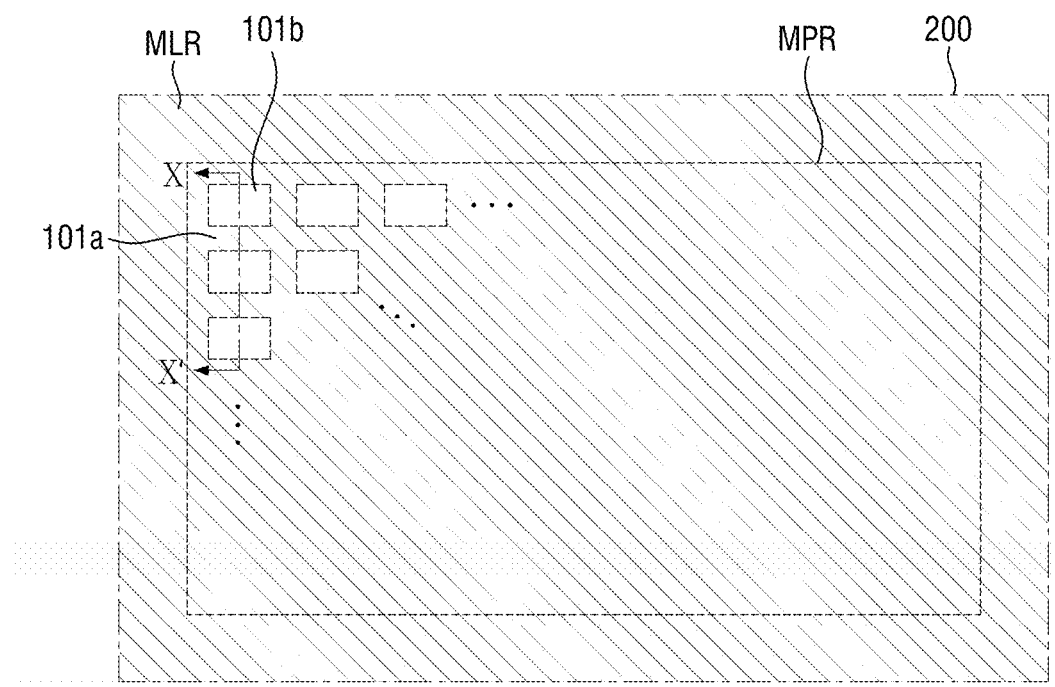
FIG. 9 is a plan view illustrating an operation of the method of manufacturing a deposition mask according to an exemplary embodiment.
Figure 10:
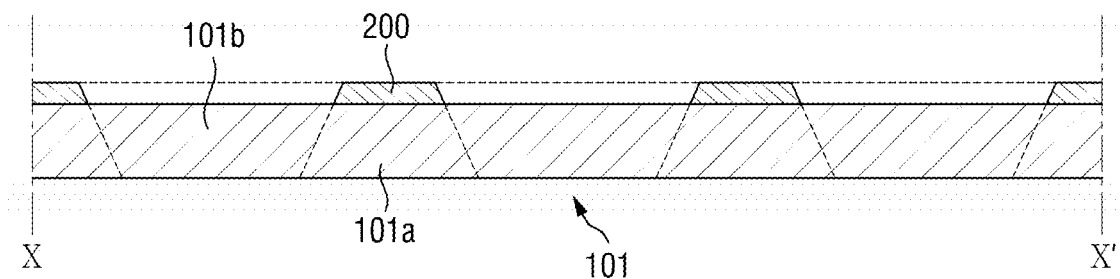
FIG. 10 is a cross-sectional view taken along line X-X' in FIG. 9.
Figure 11:
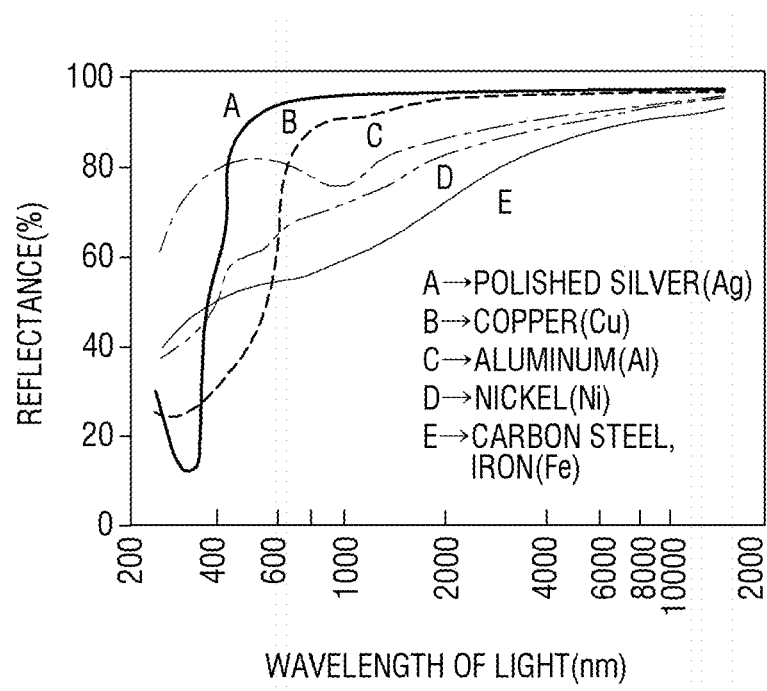
FIG. 11 is a graph illustrating reflectance according to a wavelength of light of a metal.
Figure 12:
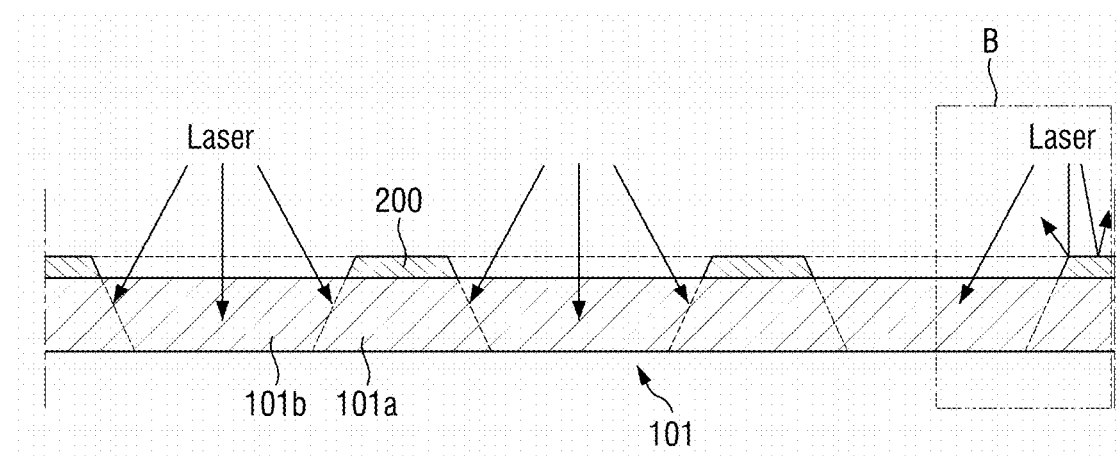
FIG. 12 is a cross-sectional view illustrating an operation of the method of manufacturing a deposition mask according to an exemplary embodiment.
Figure 13A:
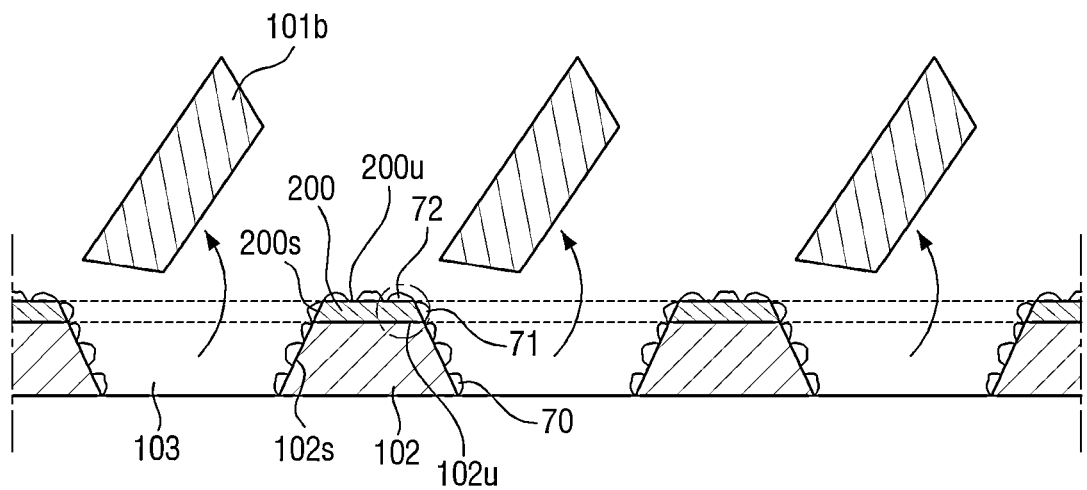
FIG. 13A is a cross-sectional view illustrating an operation of the method of manufacturing a deposition mask according to an exemplary embodiment.
Figure 13B:
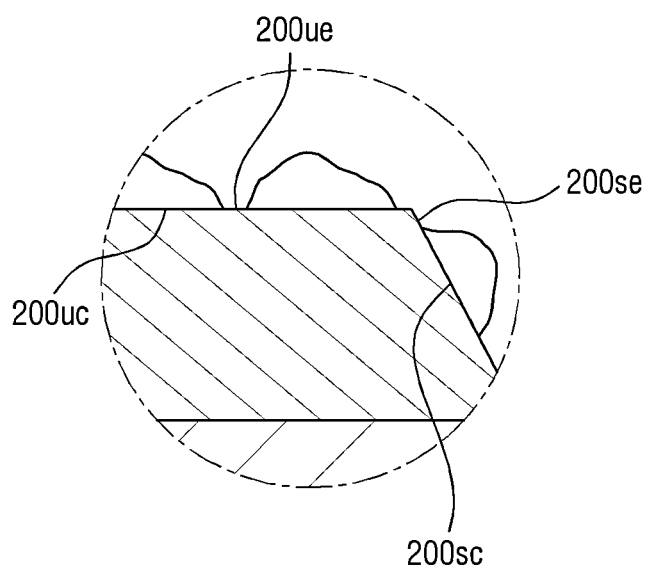
FIG. 13B is an enlarged view of the encircled portion of FIG. 13A.
Figure 14:
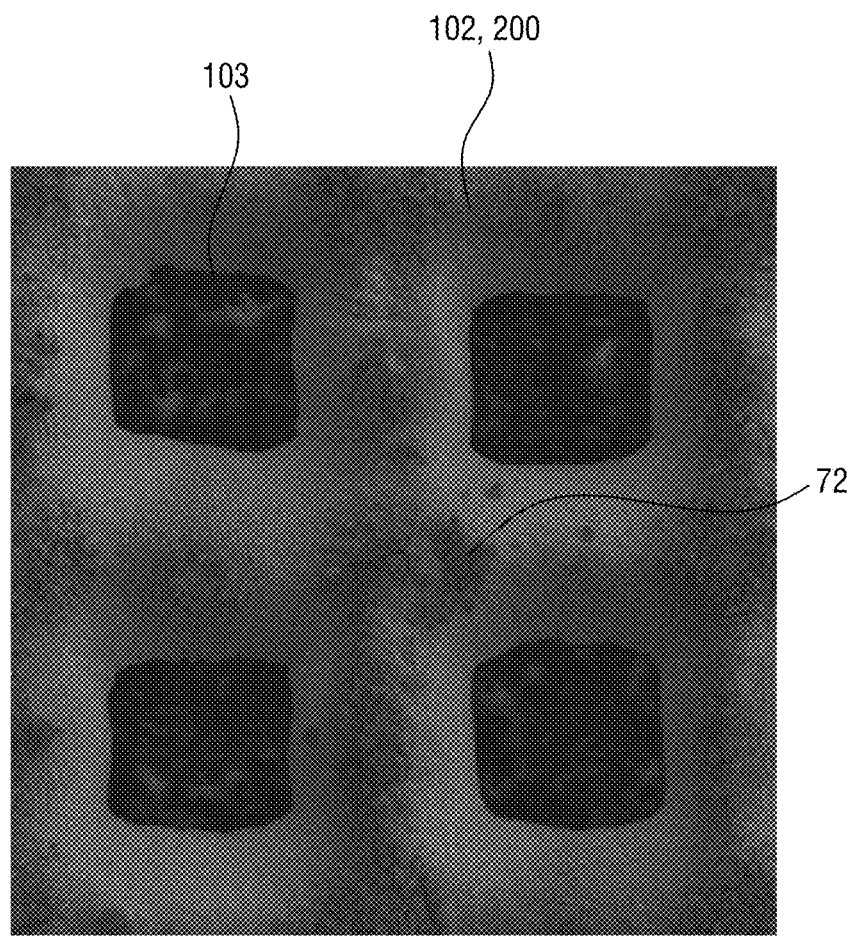
FIG. 14 is a photo illustrating a dust oxide film in an operation of the method of manufacturing a deposition mask according to an exemplary embodiment.

FIG. 8 is a flowchart illustrating a method of manufacturing the deposition mask according to an exemplary embodiment. FIG. 9 is a plan view illustrating an operation of the method of manufacturing the deposition mask according to an exemplary embodiment. FIG. 10 is a cross-sectional view taken along line X-X' in FIG. 9. FIG. 11 is a graph illustrating reflectance according to a wavelength of light of a metal. FIG. 12 is a cross-sectional view illustrating an operation of the method of manufacturing the deposition mask according to an exemplary embodiment. FIG. 13A is a cross-sectional view illustrating an operation of the method of manufacturing the deposition mask according to an exemplary embodiment, and FIG. 13B is an enlarged view of the encircled portion of FIG. 13A. FIG. 14 is a photo illustrating a dust oxide film in operation of the method of manufacturing the deposition mask according to an exemplary embodiment. FIGS. 15A to 16B are cross-sectional views illustrating operations of the method of manufacturing the deposition mask according to an exemplary embodiment.

Referring to FIGS. 8, 9, and 10, in an exemplary embodiment, a mask-target substrate 101 having a surface, on which a sacrificed layer 200 is provided or formed, is prepared (S10).

The mask-target substrate 101 is a target substrate for manufacturing the deposition mask 100. The mask-target substrate 101 may include a same material as that of the deposition mask 100 described above.

The mask-target substrate 101 includes an area 101b in which the mask hole 110 of the deposition mask 100 is to be formed and an area 101a in which the sub lip region 130 is to be formed. The area 101b, in which the mask hole 110 is to be formed, and the area 101a, in which the sub lip region 130 is to be formed, may have a same shapes and arrangement as those thereof shown in FIG. 2. In such an embodiment, the mask-target substrate 101 may include areas in which the main lip region MLR, the binding region BR, and the clamping region CPR of the deposition mask 100 are to be formed.

The sacrificed layer 200 (or a sacrificed layer pattern) is provided or formed on one surface (e.g., an upper surface) of the mask-target substrate 101. The sacrificed layer 200 may be provided or formed to substantially cover one surface of the mask-target substrate 101. The sacrificed layer 200 may be provided or formed to cover the area 101a in which the sub lip region 130 is to be formed except for the area 101b in which the mask hole 110 is to be formed as shown in FIG. 9. In such an embodiment, the sacrificed layer 200 may be formed not to overlap the area 101b in which the mask hole 110 of the mask-target substrate 101 is to be formed and to overlap the area 101a in which the sub lip region 130 is to be formed. The area 101a, in which the sub lip region 130 of the mask-target substrate 101 is to be formed, may be a cover area 101a which is covered by the sacrificed layer 200, and the area 101b, in which the mask hole 110 of the mask-target substrate 101 is to be formed, may be an exposed area 101b which is exposed by the sacrificed layer 200.

The sacrificed layer 200 may surround the exposed area 101b in the same plane. The sacrificed layer 200 may be integrally formed as a single unitary and indivisible unit in the same plane. Although partial areas of the sacrificed layer 200 are spaced apart in one direction with the exposed area 101b being interposed therebetween in FIG. 10, the sacrificed layer 200 may be integrally formed as a single unitary and indivisible unit with each other as described above. To show this, a dotted line, which connects the spaced parts of the sacrificed layer 200, is additionally shown in FIG. 10.

A structure material of the sacrificed layer 200 differs from a structure material of the mask-target substrate 101, and the sacrificed layer 200 may include materials having high reflectance with respect to lasers. The reflectance of the sacrificed layer 200 with respect to lasers may be higher than the reflectance of the mask-target substrate 101 with respect to lasers. In an exemplary embodiment, the sacrificed layer 200 may include a highly reflective material having a reflectance of about 70% with respect to lasers, and the lasers may be single-wavelength light having a wavelength within the range of about 400 nanometers (nm) to about 600 nm. In an exemplary embodiment, the sacrificed layer 200 may include or be formed of a metal such as aluminum (Al), copper (Cu), silver (Ag), or the like, but the material of the sacrificed layer 200 is not limited thereto. In one exemplary embodiment, for example, the sacrificed layer 200 may include aluminum.

Reflectance of such materials will be described in greater detail with reference to FIG. 11. In FIG. 11, a horizontal axis indicates a wavelength (nm) of light and a vertical axis indicates a reflectance (%).

Referring to FIG. 11, Ag, Cu and Al have higher reflectance than that of nickel, carbon steel (or iron (Fe)) within an entirety of a light wavelength range. Particularly, with respect to light having a wavelength within the range of about 400 nm to about 600 nm, Ag, Cu and Al have reflectance of about 70% or greater, and nickel, carbon steel (or Fe) have reflectance in a range of about 40% to about 60%. In an exemplary embodiment where laser light having a wavelength within the range of about 400 nm to about 600 nm is applied, a reflectance of the sacrificed layer 200 with respect to the lasers may be higher than a reflectance of the mask-target substrate 101. In such an embodiment, an Invar alloy may be used as the material of the mask-target substrate 101, and at least one of Al, Cu, and Ag may be used as the material of the sacrificed layer 200. The reflectance of the sacrificed layer 200 may be about 70% or greater, and the reflectance of the mask-target substrate 101 may be in a range of about 40% to about 60%.

Referring back to FIG. 10, a cross-sectional shape of the sacrificed layer 200 may have a width which gradually decreases from a lower surface toward an upper surface. That is, the cross-sectional shape of the sacrificed layer 200 may be a tapered shape.

The cross-sectional shape of the sacrificed layer 200 may be variously modified by a process of forming the sacrificed layer 200. Such a process will hereinafter be described in detail.

Referring to FIGS. 8 and 12, a laser device is disposed on the sacrificed layer 200 and the mask-target substrate 101 and lasers of the laser device are emitted toward the mask-target substrate 101 which is exposed by the sacrificed layer 200 (S20). In one exemplary embodiment, for example, the lasers may have a wavelength in a range of about 400 nm to about 600 nm.

The lasers remove the exposed area 101b of the mask-target substrate 101. In operation S20 of FIG. 8 in which the lasers are emitted toward the mask-target substrate 101 exposed by the sacrificed layer 200, the lasers may be partially emitted toward the cover area 101a of the mask-target substrate 101 which is covered by the sacrificed layer 200 due to an alignment error that may partially occur in the laser device.

In an exemplary embodiment, the sacrificed layer 200 includes materials having high reflectance with respect to lasers as described above. Consequently, even when lasers are emitted toward the cover area 101a of the mask-target substrate 101, most incident lasers (for example, about 80% or more) are reflected such that an amount of lasers emitted directly toward the cover area 101a of the mask-target substrate 101 may not be great.

In such an embodiment, the lasers which are incident onto the exposed area 101b pass through the mask-target substrate 101 having a small reflectance with respect to lasers relatively more than the sacrificed layer 200 such that an adequate amount of lasers may be emitted directly toward the exposed area 101b of the mask-target substrate 101.

In an exemplary embodiment of a method of manufacturing the deposition mask 100, the sacrificed layer 200, which blocks lasers, is disposed in an area excluding the exposed area 101b of the mask-target substrate 101 to increase a degree of precision in a laser patterning process.

In an exemplary embodiment, as shown in an area B of FIG. 12, lasers may be not be emitted adequately toward the exposed area 101b of the mask-target substrate 101 by the laser device in which the alignment error partially occurs. In this case, the laser device may emit an adequate amount of lasers toward an entirety of the exposed area 101b of the mask-target substrate 101 by adjusting an emission range and intensity of lasers.

Referring to FIGS. 8, 13, and 14, in such an embodiment, the exposed area 101b of the mask-target substrate 101, toward which the lasers are emitted, is removed (S30).

The operation (S30) of removing the exposed area 101b of the mask-target substrate 101, toward which the lasers are emitted, includes the cover area 102 of the mask-target substrate 101 remaining. The cover area 102 of the mask-target substrate 101 is the sub lip region 130 of the deposition mask 100 which remains after performing following operations as shown in FIG. 2. After the operation (S30) of removing the exposed area 101b of the mask-target substrate 101, a hole area 103 may be formed between the cover areas 102 as shown in FIG. 13. The hole area 103 is the mask hole 110 of the deposition mask 100, which remains as shown in FIG. 2.

In an exemplary embodiment, as shown in FIGS. 13A, 13B and 14, in a process of forming the final mask hole 110 of the deposition mask 100, dust oxide films 70, 71, and 72 may be formed on inner surfaces 102s of the cover area 102 of the mask-target substrate 101 and an upper surface 200u and opposing side surfaces 200s of the sacrificed layer 200.

The dust oxide film 70 may partially cover and expose the inner surfaces 102s of the cover area 102 of the mask-target substrate 101. In such an embodiment, the dust oxide films 71 and 72 may partially cover and expose the upper surface 200u and the opposing side surfaces 200s of the sacrificed layer 200, respectively. In such an embodiment, the upper surface 200u and the opposing side surfaces 200s of the sacrificed layer 200 may include, respectively, an upper surface cover area 200uc and side surface cover areas 200sc, which are covered by the dust oxide films 71 and 72 and may include, respectively, an upper exposed area 200ue and side surface exposed areas 200se, which are exposed by the dust oxide films 71 and 72.

In such an embodiment, the inner surfaces 102s of the cover area 102 of the mask-target substrate 101 may include an area covered by the dust oxide film 70 and an area exposed by the dust oxide film 70.

Alternatively, the dust oxide film 70 may cover all of the inner surfaces 102s of the cover area 102 of the mask-target substrate 101, and the dust oxide films 71 and 72 may cover all of the upper surfaces 200u and the opposing side surfaces 200s of the sacrificed layer 200.

Referring to FIGS. 8, 15A, 15B, 16A and 16B, the sacrificed layer 200 is removed from a surface of the cover area 102 of the mask-target substrate (S40).

The operation S40 of removing the sacrificed layer 200 from the surface of the cover area 102 of the mask-target substrate may include etching the sacrificed layer 200 using a first etchant.

The first etchant may include an acid etching solution or an alkali etching solution. Materials which are applicable for the acid etching solution may be inorganic acids such as a hydrochloric acid, a sulfuric acid, a nitric acid, hydrogen fluoride, and the like, a formic acid, an oxalic acid, a citric acid, an acetic acid, a benzoic acid, and the like, but materials are not limited thereto. Materials which are applicable for the alkali etching solution may be hydroxides of alkali metals such as sodium hydroxide, potassium hydroxide, lithium hydroxide, and the like, hydroxides of alkali earth metals such as calcium hydroxide and the like, inorganic alkali metallic salts such as sodium carbonate and the like, organic alkali metallic salts such as sodium acetate and the like, an ammonia solution, and the like, but materials are not limited thereto. In an exemplary embodiment, the first etchant may include hydroxides of sodium hydroxide. In other embodiments, the first etchant may include a hydrochloric acid.

In the operation of etching the sacrificed layer 200 using the first etchant, etching rates of the sacrificed layer 200 and the cover area 102 of the mask-target substrate differ from each other. In such an embodiment, the selected first etchant may mainly etch the sacrificed layer 200 and may barely etch the cover area 102 of the mask-target substrate. In one exemplary embodiment, for example, the etching rate of the sacrificed layer 200 may be five times or greater than, or twenty times or greater than the etching rate of the cover area 102 of the mask-target substrate.

In the operation of etching the sacrificed layer 200 using the first etchant, the sacrificed layer 200 may be etched by being dipped in the first etchant, but the operation is not limited thereto. Alternatively, the sacrificed layer 200 may be etched by scattering the first etchant on the sacrificed layer 200.

Figure 15A:
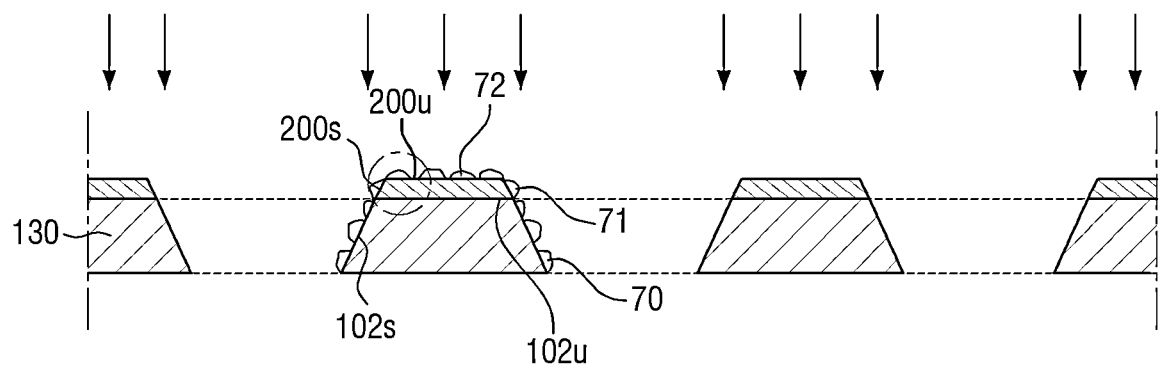
FIGS. 15A to 16B are cross-sectional views illustrating operations of the method of manufacturing a deposition mask according to an exemplary embodiment.
Figure 15B:
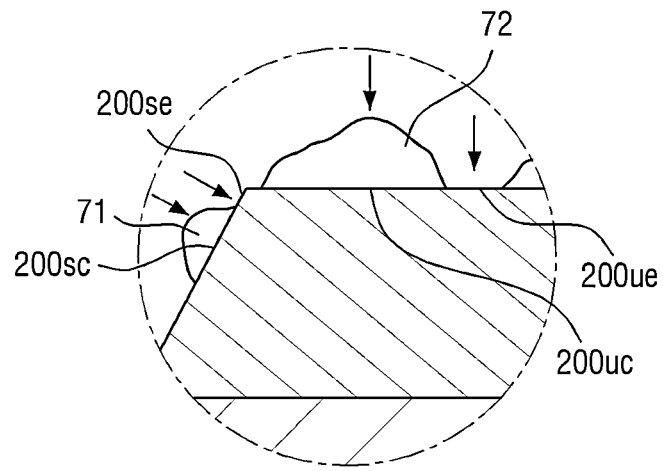

The first etchant may permeate the sacrificed layer 200 to remove the sacrificed layer 200 from a surface of the cover area 102. A path in which the first etchant permeates the sacrificed layer 200 may be a path of permeating directly through the upper surface exposed area 200ue and the side surface exposed area 200se of the sacrificed layer 200 as shown in FIG. 15B, which is an enlarged view of the encircled portion of FIG. 15A. The first etchant may not permeate the sacrificed layer 200 directly through the upper surface cover area 200uc and the side surface cover area 200sc due to the dust oxide films 71 and 72 which are disposed in corresponding areas. In an exemplary embodiment, the first etchant may permeate the upper surface cover area 200uc and the side surface cover area 200sc of the sacrificed layer 200 by passing through the dust oxide films 71 and 72 directly, but the disclosure is not limited thereto.

The operation of etching the sacrificed layer 200 using the first etchant may be performed during a process time of about 30 minutes. The process time consumed for the operation of etching the sacrificed layer 200 using the first etchant may be equal to or less than a time consumed for an operation of removing the dust oxide film 70, which will be described below, by etching using a second etchant.

The operation S40 of removing the sacrificed layer 200 from the surface of the cover area 102 of the mask-target substrate includes an operation of removing the dust oxide films 71 and 72 disposed on the side surface cover area 200sc and the upper surface cover area 200uc of the sacrificed layer 200.

Figure 16A:
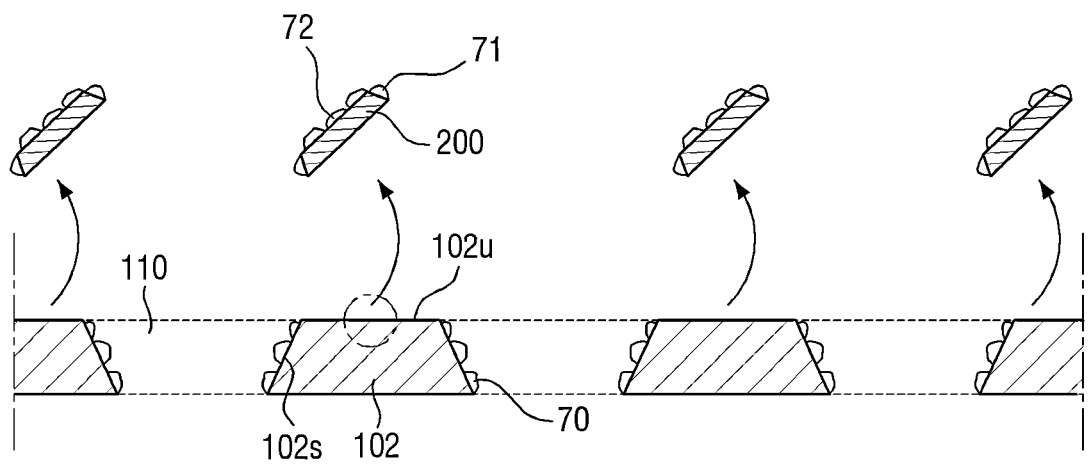
Figure 16B:
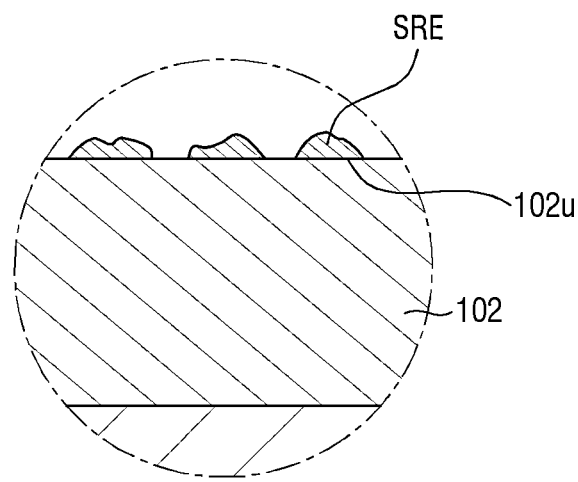

After the operation S40 of removing the sacrificed layer 200 from the surface of the cover area 102 of the mask-target substrate is performed, the residual film SRE of the partial sacrificed layer 200 may remain on the upper surface 102u of the cover area 102 as shown FIG. 16B, which is an enlarged view of the encircled portion of FIG. 16A. The residual film SRE is a residual of the partially remaining sacrificed layer 200 which is not completely removed during a process of removing the sacrificed layer 200 and may include a same material as that of the sacrificed layer 200.

In an exemplary embodiment, an etching time and density of the first etchant may be adjusted in a way such that the residual film SRE does not remain on the upper surface 102u of the cover area 102.

In an exemplary embodiment, the dust oxide film 70 formed on the inner surface 102s of the cover area 102 of the mask-target substrate is removed (S50).

The operation S50 of removing the dust oxide film 70 formed on the inner surface 102s of the cover area 102 of the mask-target substrate may include an operation of etching the dust oxide film 70 using the second etchant.

The second etchant may include an acid etching solution or an alkali etching solution. The second etchant may be selected from the materials of the first etchant described above. In an exemplary embodiment, the second etchant may include an oxalic acid solution.

In the operation of etching the dust oxide film 70 using the second etchant, the dust oxide film 70 may be etched while the cover area 102 is not etched.

In such an embodiment, the second etchant has etching properties with respect to the dust oxide film 70 but may not have etching properties with respect to the cover area 102.

In an alternative exemplary embodiment, where the second etchant has etching properties with respect to not only the dust oxide film 70 but also the cover area 102, the cover area 102 may be effectively prevented from being etched by the second etchant using process conditions such as an etching time and the like.

The operation of etching the dust oxide film 70 using the second etchant may be performed during a process time of about 30 hours to 47 hours. The process time consumed for the operation of etching the dust oxide film 70 using the second etchant may be significantly greater than the process time consumed for the operation of removing the sacrificed layer 200 by etching using the first etchant.

In such an embodiment, although the dust oxide film 70 formed on the inner surface 102s of the cover area 102 of the mask-target substrate is removed, the dust oxide film DRE, which is a residual, may remain on the inner surface of the sub lip region 130 as shown in FIG. 5 (or the cover area 102 of FIG. 16).

When the sacrificed layer 200 is not disposed on the mask-target substrate 101, dust oxide films may be formed on all of the upper surface and side surface of the cover area 101a of the mask-target substrate 101 in the operation of removing the exposed area 101b of the mask-target substrate 101 using lasers. A process time of about 65 hours to about 80 hours may be consumed to remove all the dust oxide films formed on the upper surface and the side surfaces of the cover area 101a of the mask-target substrate 101. However, in exemplary embodiments where the sacrificed layer 200 is formed on the mask-target substrate 101, the dust oxide films are formed on all of the upper surface and the side surfaces of the sacrificed layer 200 and the inner surfaces of the cover area 101a. However, since the dust oxide films formed on the upper surface and the side surfaces of the sacrificed layer 200 may be removed with the sacrificed layer 200 at most within about 30 minutes as described above, it a process time may be reduced significantly more than the above-described process time of about 65 hours to 80 hours.

In an exemplary embodiment, when intensity of the lasers emitted to remove the exposed area 101b of the mask-target substrate 101 is increased, efficiency may increase in the operation of removing the exposed area 101b of the mask-target substrate 101. Such an operation will be described with reference to FIGS. 17 and 18.

Figure 17:
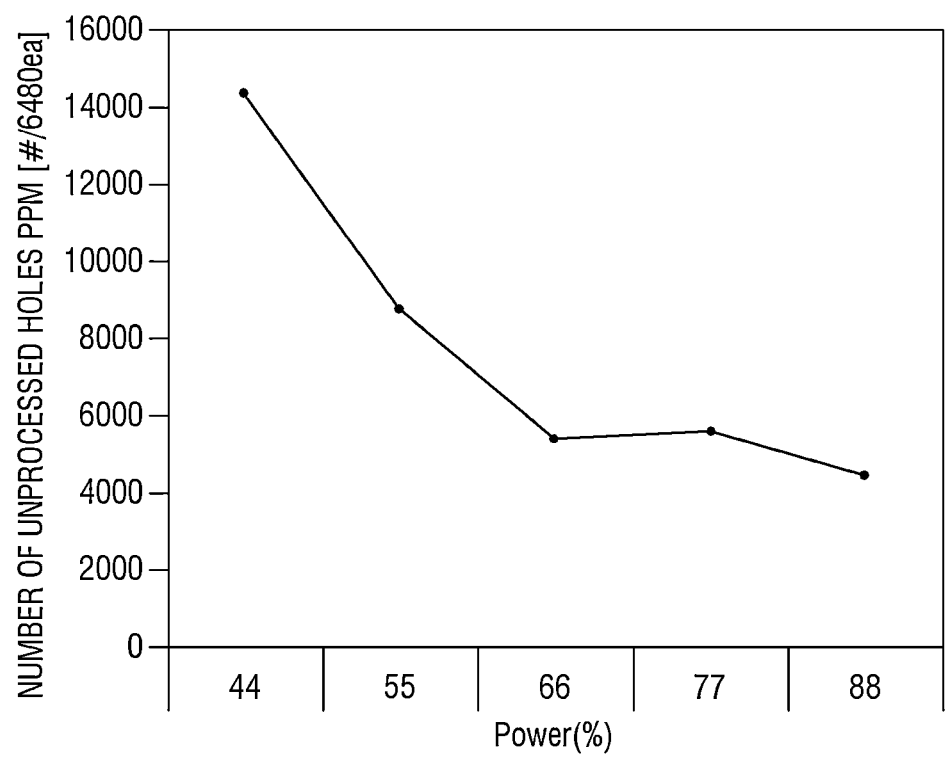
FIG. 17 is a graph illustrating a correlation between intensity of a laser and the number of unprocessed holes.
Figure 18:
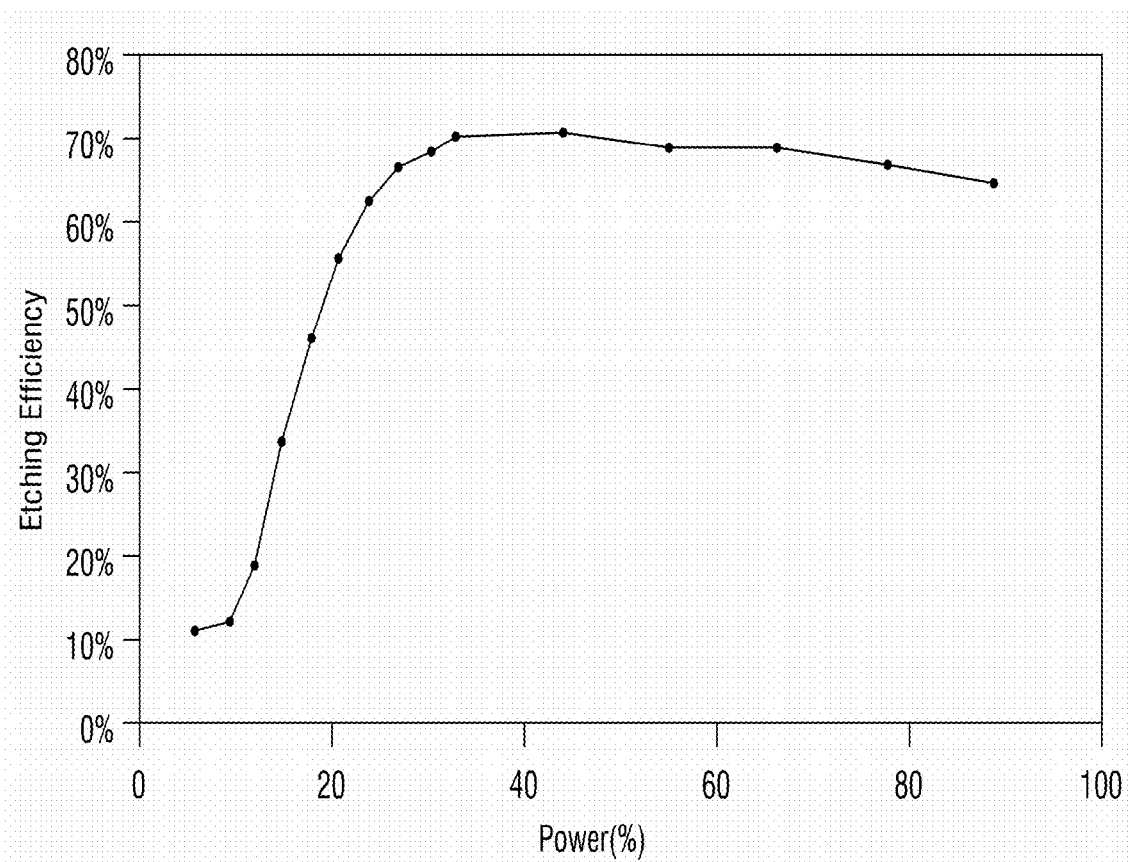
FIG. 18 is a graph illustrating a correlation between intensity of a laser and efficiency in etching.

FIG. 17 is a graph illustrating a correlation between intensity of a laser and the number of unprocessed holes, and FIG. 18 is a graph illustrating a correlation between intensity of a laser and efficiency in etching. In FIG. 17, a horizontal axis indicates intensity (%) of lasers and a vertical axis indicates the number of unprocessed mask holes per unit area. In FIG. 18, a horizontal axis indicates intensity (%) of lasers and a vertical axis indicates efficiency of forming mask holes.

Referring to FIG. 17, as the intensity of lasers increases, the exposed area 101b which is not removed from the mask-target substrate 101, that is, the number of unprocessed holes per unit area (PPM(#6480ea)), gradually decreases. In other words, it may be seen that the number of the exposed areas 101b removed from the mask-target substrate 101 increases as the intensity of lasers increases. Referring to FIG. 18, it is shown that the efficiency in forming mask holes increases as the intensity (%) of lasers increases.

As the intensity of lasers increases, an amount of dust oxide films, which occur when mask holes are formed in the mask-target substrate 101, may increase.

However, in exemplary embodiments where the sacrificed layer 200 is disposed on the mask-target substrate 101, even when the intensity of lasers increases such that the amount of the dust oxide films 70, 71, and 72 formed on the upper surface and the side surfaces of the sacrificed layer 200 and the side surfaces of the cover area 101a increases, the dust oxide films formed on the upper surface and the side surfaces of the sacrificed layer 200 with the sacrificed layer 200 may be removed at most within about 30 minutes as described above. In such embodiments, since a process time for removing the dust oxide films is significantly reduced even when the intensity of lasers is adequately increased to efficiently form mask holes, an entirety of the process time of the deposition mask 100 is reduced to increase processing efficiency.

Hereinafter, an exemplary embodiment of the operation S10 of preparing the mask-target substrate having a surface on which a sacrificed layer is formed will be described below in detail.

Figure 19:
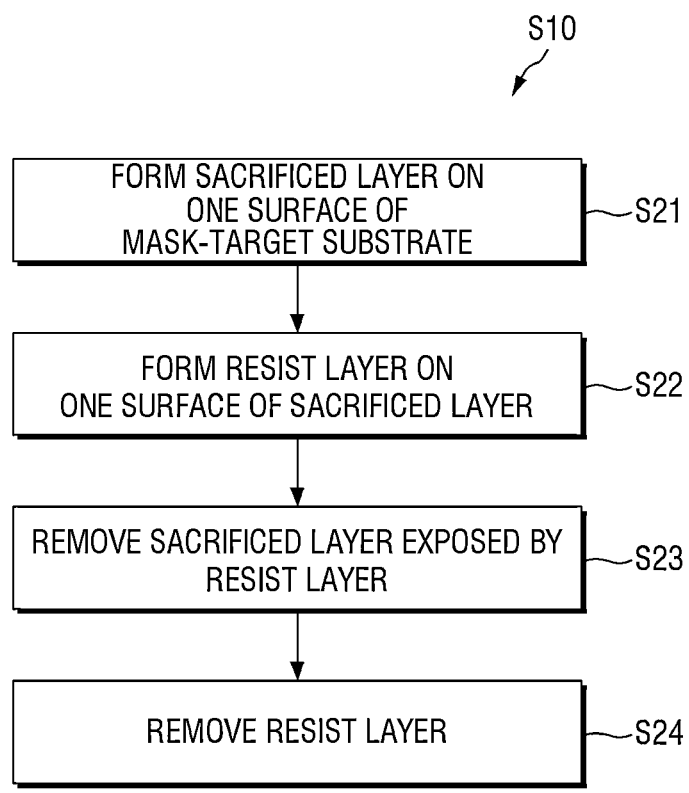
FIG. 19 is a flowchart illustrating operations of forming a sacrificed layer according to an exemplary embodiment.
Figure 20:
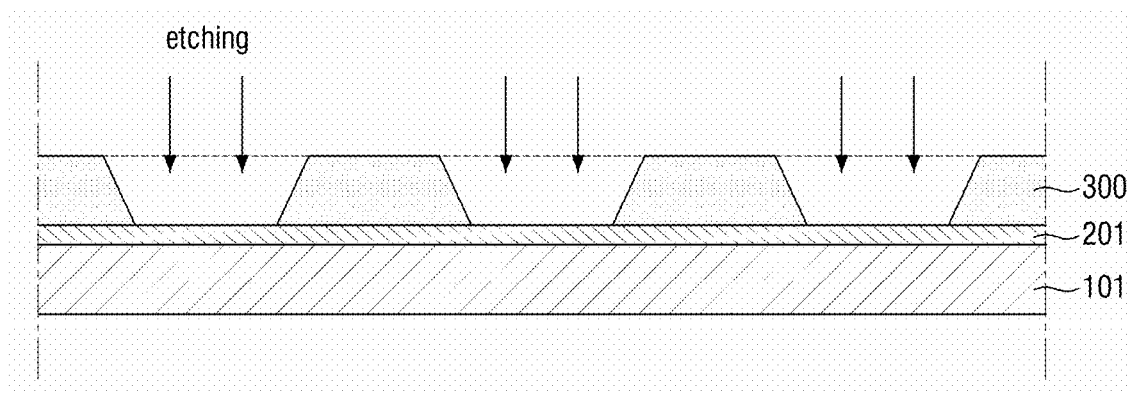
FIG. 20 is a cross-sectional view illustrating the operation shown in FIG. 19.

FIG. 19 is a flowchart illustrating operations of forming a sacrificed layer according to an exemplary embodiment, and FIG. 20 is a cross-sectional view illustrating the operation shown in FIG. 19.

Referring to FIGS. 10, 19, and 20, a sacrificed layer 201 may be provided or formed on a mask-target substrate using photolithography in the operation S10 of preparing the mask-target substrate having a surface on which the sacrificed layer is formed.

In the operation S10 of preparing the mask-target substrate having a surface on which the sacrificed layer is formed, first, the sacrificed layer 201 is provided or formed on a surface of the mask-target substrate 101 (S21). The operation S21 of providing or forming the sacrificed layer 201 on a surface of the mask-target substrate 101 may include an operation of integrally forming the sacrificed layer 201 on an entirety of the mask-target substrate 101.

In such an embodiment, a resist layer 300 is formed on a surface of the sacrificed layer 201 (S22). An operation S22 of forming the resist layer 300 may include an operation of forming the resist layer 300 to overlap an area in which the sacrificed layer 200 of FIG. 10 is to be formed. The resist layer 300 may expose a part of the sacrificed layer 201 and may cover another part thereof.

In an exemplary embodiment, the resist layer 300 may be a light-cured resin. In one exemplary embodiment, for example, the resist layer 300 may include at least one of acrylic resin, styrene resin, olefin resin, polycarbonate resin, polyester resin, epoxy resin, silicone resin, and the like. In an exemplary embodiment, the resist layer 300 may be thermoplastic resin.

A cross-sectional shape of the resist laser 300 may be a tapered shape having a width which gradually decreases from a lower surface toward an upper surface as shown in FIG. 20. Such a shape may be formed when the resist layer 300 includes a negative photosensitive material. In an alternative exemplary embodiment, the cross-sectional shape of the resist layer 300 may be a reverse-tapered shape having a width which gradually increases from a lower surface toward an upper surface. Such a shape may be formed when the resist layer 300 includes a positive photosensitive material.

In such an embodiment, the sacrificed layer 201, which is exposed by the resist layer 300, is removed (S23).

The operation S23 of removing the sacrificed layer 201, which is exposed by the resist layer 300, may include an operation of removing a portion of the sacrificed layer 201, which is exposed by the resist layer 300, by etching.

After the operation S23 of removing the portion of the sacrificed layer 201 which is exposed by the resist layer 300, the resist layer 300 is removed (S24). After the resist layer 300 is removed, the sacrificed layer 200 shown in FIG. 10 may be formed. In an exemplary embodiment, the cross-sectional shape of the sacrificed layer may be variously modified by a process of forming the sacrificed layer 200, to be different from that shown in FIG. 10. Such a process will be described with reference to FIGS. 21 and 22.

Figure 21:
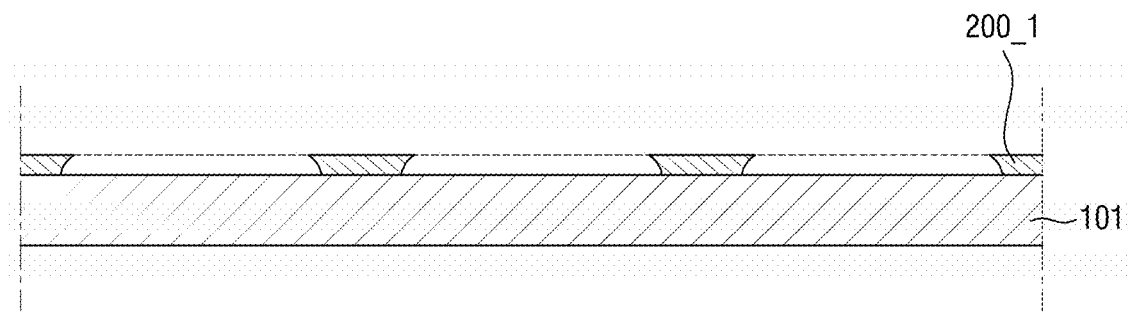
FIG. 21 is a cross-sectional view illustrating a sacrificed layer according to an exemplary embodiment.
Figure 22:
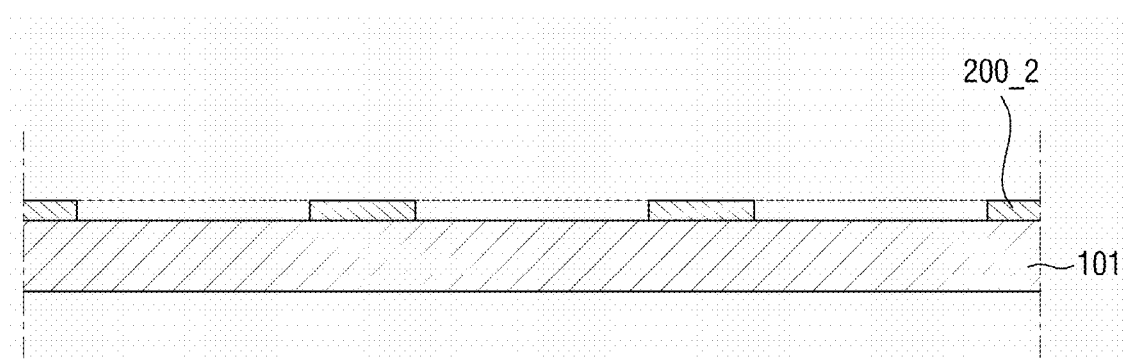
FIG. 22 is a cross-sectional view illustrating a sacrificed layer according to an alternative exemplary embodiment.

FIG. 21 is a cross-sectional view illustrating a sacrificed layer according to an alternative exemplary embodiment, and FIG. 22 is a cross-sectional view illustrating a sacrificed layer according to another alternative exemplary embodiment.

When the operation of removing the portion of the sacrificed layer 201 which is exposed by the resist layer 300 by etching is performed by wet-etching, a cross-sectional shape of a sacrificed layer 200_1 may include a bent surface in which an inner surface of the sacrificed layer 200_1 is bent internally and may be a substantially reverse-tapered shape in which a width of the sacrificed layer 200_1 gradually increases from a lower surface toward an upper surface as shown in FIG. 21.

Alternatively, when the operation of removing the sacrificed layer 201 which is exposed by the resist layer 300 by etching is performed by dry-etching, a plane shape of a sacrificed layer 200_2 may be a rectangular shape in which a width of a lower surface is substantially equal to a width of an upper surface as shown in FIG. 22.

Hereinafter, an alternative exemplary embodiment of the operation S10 of preparing the mask-target substrate having a surface on which a sacrificed layer is formed will be described below in detail. Any repetitive detailed description of the same or like components as those of the embodiments shown in FIGS. 19 and 20 will be omitted.

Figure 23:
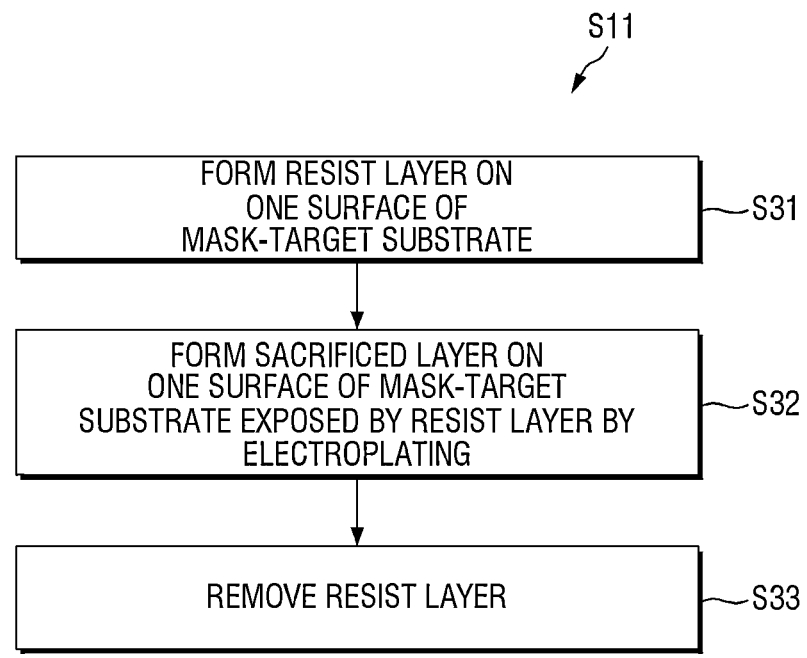
FIG. 23 is a flowchart illustrating operations of forming the sacrificed layer according to an alternative exemplary embodiment.
Figure 24:
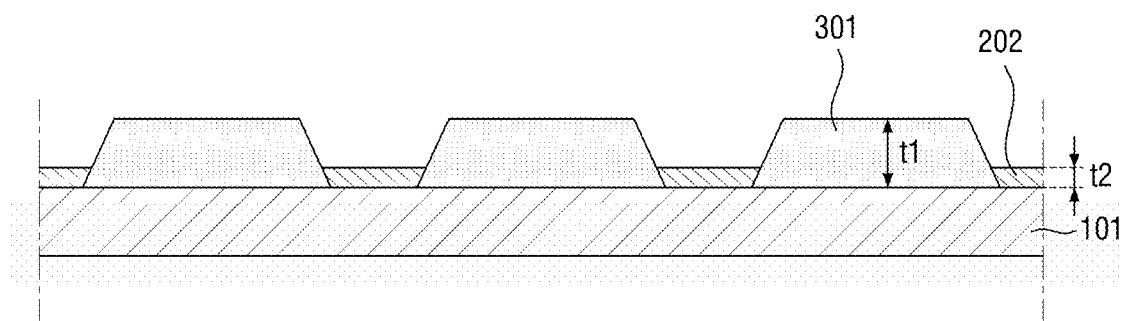
FIG. 24 is a cross-sectional view illustrating the operation shown in FIG. 23.

FIG. 23 is a flowchart illustrating operations of forming the sacrificed layer according to an alternative exemplary embodiment, and FIG. 24 is a cross-sectional view illustrating the operation shown in FIG. 23.

Referring to FIGS. 10, 23, and 24, such an embodiment of an operation (S11) of preparing a mask-target substrate on which a sacrificed layer is formed is substantially the same as the embodiments of FIG. 19 except that a resist layer 301 is formed first on a surface of the mask-target substrate 101.

In such an embodiment, the resist layer 301 is formed on one surface of the mask-target substrate 101 (S31).

Subsequently, a sacrificed layer is formed on a surface of the mask-target substrate 101, which is exposed by the resist layer 301, using an electroplating method (S32).

A first thickness t1 of the resist layer 301 may be greater than a second thickness t2 of a sacrificed layer 202 which is formed through the above-described process.

Alternatively, the sacrificed layers 202, which are formed on an upper surface and side surfaces of the resist layer 301, may be partially connected. In such an embodiment, a difference between the first thickness t1 and the second thickness t2 is not so great as to maintain a certain level of a step coverage. Such an embodiment will be described in greater detail with reference to embodiments shown in FIGS. 25 and 26.

Afterward, the resist layer 301 is removed (S33).

Figure 25:
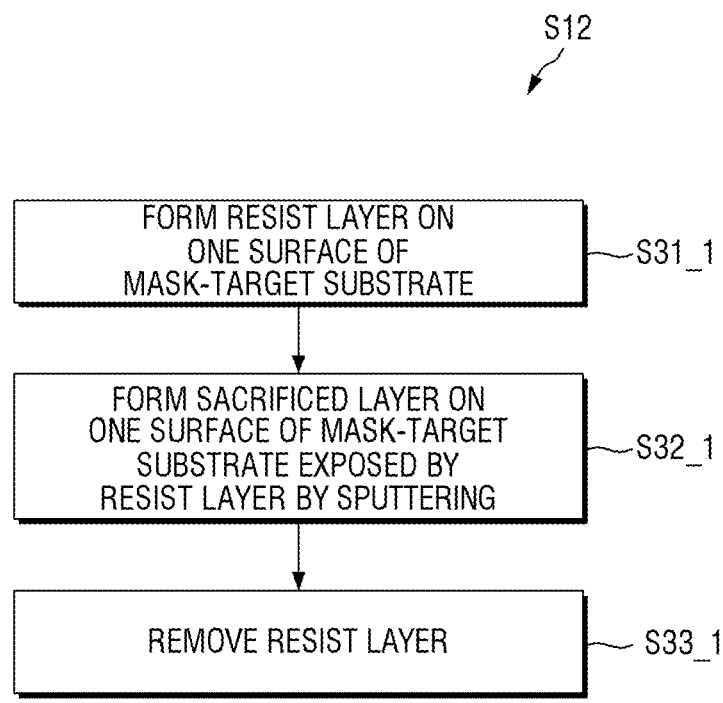
FIG. 25 is a flowchart illustrating operations of forming the sacrificed layer according to another alternative exemplary embodiment.
Figure 26:
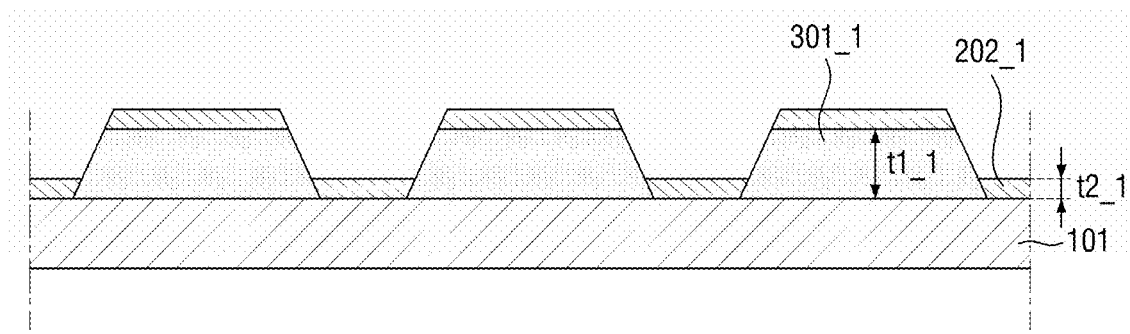
FIG. 26 is a cross-sectional view illustrating the operation shown in FIG. 25.

FIG. 25 is a flowchart illustrating operations of forming the sacrificed layer according to another alternative exemplary embodiment, and FIG. 26 is a cross-sectional view illustrating the operation shown in FIG. 25.

Referring to FIGS. 10, 25, and 26, the operation S12 of forming the sacrificed layer includes forming the resist layer 301_1 on a surface of the mask-target substrate 101 (S31), forming the sacrificed layer 202_1 on a surface of the mask-target substrate 101, which is exposed by the resist layer 301_1, by sputtering (S32_1), and removing the resist layer 301_1 (S33_1).

In such an embodiment, through the above-described process, the sacrificed layer 202_1 may be formed not only in a space between the adjacent resist layers 301_1 in a same plane but also on an upper surface of the resist layer 301_1. In such an embodiment, an operation of removing the sacrificed layer 202_1 which is exposed by the resist layer 301_1 may include an operation of removing the sacrificed layer 202_1 disposed on the upper surface of the resist layer 301_1.

A first thickness t1_1 of the resist layer 301_1 may be greater than a second thickness t2_1 of the sacrificed layer 202_1 which is formed through the above-described process. When the first thickness t1_1 of the resist layer 301_1 is significantly greater than the second thickness t2_1 of the sacrificed layer 202_1, the sacrificed layers 202_1, which are formed on the upper surface and the side surfaces of the resist layer 301_1, may not be connected and may be separated due to a low step coverage as shown in FIG. 25.

In such an embodiment, an etching solution which removes the resist layer 301_1 may permeate the resist layer 301_1 through inner surfaces of the resist layer 301_1 exposed by the sacrificed layer 202_1 and may not permeate through inner surfaces of the resist layer 301_1 covered by the sacrificed layer 202_1.

In an exemplary embodiment, an etching solution may permeate inner surfaces of the resist layer 301_1 covered by the sacrificed layer 202_1 according to a type and concentration of the etching solution.

Alternatively, the sacrificed layers 202_1, which are formed on the upper surface and side surfaces of the resist layer 301_1, may be partially connected. In such an embodiment, a difference between the first thickness t1_1 and the second thickness t2_1 may not be so great as to maintain a certain level of a step coverage. The etching solution, which removes the resist layer 301_1, may permeate the resist layer 301_1 through an area which is not covered by the sacrificed layer 202_1. However, etching efficiency of the resist layer 301_1 may not be high in comparison to the above-described embodiments.

Also, when the sacrificed layers 202_1, which are formed on the upper surface and the side surfaces of the resist layer 301_1, are partially connected, since the sacrificed layers 202_1, which are formed on the upper surface and side surfaces, are connected, more time is spent to remove the resist layers 301_1. Accordingly, the first thickness t1_1 of the resist layer 301_1 is formed to be greater than the second thickness t2_1 of the sacrificed layer 202_1 to improve efficiency overall in the process of forming the sacrificed layer 202_1 such that the sacrificed layers 202_1 which are formed on the upper surface and side surfaces of the resist layer 301_1 may not be connected and may be separated.

According to exemplary embodiments of the disclosure, the method of manufacturing a deposition mask, in which process efficiency of the deposition mask is improved, may be provided.

According to other exemplary embodiments of the disclosure, the deposition mask having improved process efficiency may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A deposition mask comprising:
   a mask body which comprises a plurality of hole areas disposed while being spaced apart from each other and a lip region which surrounds each of the hole areas; and
   a dust oxide film disposed on an inner surface of the lip region which faces the hole area of the mask body.

2. The deposition mask of claim 1, wherein the dust oxide film is not disposed on an upper surface of the lip region of the mask body.

3. The deposition mask of claim 1, wherein
   the mask body comprises an Invar alloy which comprises nickel and iron, and
   the dust oxide film comprises a nickel oxide and an iron oxide.

4. The deposition mask of claim 3, further comprising:
   a residual film which is disposed on an upper surface of the lip region of the mask body and comprises a material different from a material of the dust oxide film.

5. The deposition mask of claim 4, wherein the residual film comprises at least one of aluminum, silver, and magnesium.

* * * * *